United States Patent
Saito et al.

(10) Patent No.: US 7,423,571 B2
(45) Date of Patent: Sep. 9, 2008

(54) RESISTOR-STRING DIGITAL/ANALOG CONVERTER CIRCUIT AND SEMICONDUCTOR DEVICE INCLUDING THE SAME CIRCUIT

(75) Inventors: Asami Saito, Tokyo (JP); Satoshi Sakurai, Kawasaki (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 46 days.

(21) Appl. No.: 11/515,384

(22) Filed: Sep. 5, 2006

(65) Prior Publication Data

US 2007/0052569 A1 Mar. 8, 2007

(30) Foreign Application Priority Data

Sep. 5, 2005 (JP) .............................. 2005-256822

(51) Int. Cl.
*H03M 1/68* (2006.01)
(52) U.S. Cl. ...................................... 341/145; 341/136
(58) Field of Classification Search ................. 341/136, 341/144, 145, 154
See application file for complete search history.

(56) References Cited

U.S. PATENT DOCUMENTS

| | | | |
|---|---|---|---|
| 5,943,000 A | 8/1999 | Nessi et al. | |
| 6,204,785 B1 * | 3/2001 | Fattaruso et al. | 341/120 |
| 6,570,520 B2 * | 5/2003 | Ishii | 341/144 |

* cited by examiner

*Primary Examiner*—Howard Williams
(74) *Attorney, Agent, or Firm*—Banner & Witcoff, Ltd

(57) ABSTRACT

A resistor-string digital/analog converter circuit includes a plurality of resistors configured to divide a predetermined voltage, a plurality of MOS transistors configured to divide a voltage generated across one resistor of the plurality of resistors, a control circuit configured to control a connection between the one resistor and the plurality of MOS transistors so as to supply to the plurality of MOS transistors the voltage generated across the one resistor, and a gate potential generating circuit. The gate potential generating circuit generates a plurality of mutually different gate potentials and supplies the plurality of generated gate voltages, respectively, to a plurality of gates of the plurality of MOS transistors, so that the resistance values of MOS resistance of the plurality of MOS transistors are equal to each other.

20 Claims, 7 Drawing Sheets

RESISTOR-STRING DIGITAL/ANALOG CONVERTER CIRCUIT AND SEMICONDUCTOR DEVICE INCLUDING THE SAME CIRCUIT

CROSS-REFERENCE TO RELATED APPLICATIONS

This application is based upon and claims the benefit of priority from the prior Japanese Patent Application No. 2005-256822 filed on Sep. 5, 2005; the entire contents of which are incorporated herein by reference.

BACKGROUND OF THE INTENTION

1. Field of the Invention

The present invention relates to a resistor-string digital/analog converter circuit and a semiconductor device including the same circuit, and more particularly to a resistor-string digital/analog converter circuit using MOS resistance as interpolation resistance, and a semiconductor device including the same circuit.

2. Description of Related Art

As one sort of digital/analog converter circuit (hereinafter, "D/A" for short), there has hitherto been known a resistor-string D/A converter circuit (R-DAC). In the resistor-string D/A converter circuit, a plurality of resistors connected in series are used and an analog voltage is extracted from a voltage dividing point corresponding to an input digital signal, whereby D/A conversion is performed. Generally, in the resistor-string digital/analog converter circuit, resolution is sometimes improved using interpolation resistance.

There has been proposed a technique by which, when a plurality of MOS resistances are used as the interpolation resistance, in order to reduce the variation in MOS resistance value ascribable to body effect, a source potential of one MOS transistor among the interpolation resistances is monitored to vary the gate potential of each MOS transistor (for example, refer to U.S. Pat. No. 5,943,000).

More specifically, the source potential ($V_{pol}$) of one MOS transistor of the interpolation resistances are monitored and the gate potential ($V_{gate}$) created based on the source potential ($V_{pol}$) monitored is supplied to the gate of all the MOS transistors. Accordingly, the technique according to the proposal reduces the variation in MOS resistance value caused by a variation in position to which the MOS transistors are connected, thereby improving linearity of D/A conversion.

However, in the technique according to the proposal, the source potential differs between each MOS transistor, and MOS resistance value is in inverse proportion to the difference between gate-source voltage ($V_{gs}$) and threshold voltage ($V_{th}$). Therefore, the MOS resistance values of the plurality of MOS transistors are not equal to each other, thus causing a problem.

That is, even when the same potential is applied to the gates of all the MOS transistors, since the source potential of each MOS transistor is different, there arises a difference in gate-source voltage ($V_{gs}$), causing nonuniformity of MOS resistance values. Consequently, satisfactory linearity of D/A conversion cannot be achieved. Particularly, when a large voltage is applied to the plurality of MOS transistors, the nonuniformity is noticeable.

BRIEF SUMMARY OF THE INVENTION

According to one aspect of the present invention, there is provided a resistor-string digital/analog converter circuit converting a digital signal into an analog signal, the circuit including: a plurality of resistors configured to divide a predetermined voltage; a plurality of MOS transistors configured to divide a voltage generated across one resistor of the plurality of resistors; a control circuit configured to control a connection between the one resistor and the plurality of MOS transistors so as to supply to the plurality of MOS transistors the voltage generated across the one resistor; and a gate potential generating circuit configured to generate a plurality of mutually different gate potentials and supply the plurality of generated gate voltages, respectively, to a plurality of gates of the plurality of MOS transistors so as to make the resistance values of MOS resistance of the plurality of MOS transistors equal to each other.

According to one aspect of the present invention, there is provided a semiconductor device including a resistor-string digital/analog converter circuit converting a digital signal into an analog signal, the semiconductor device including: a plurality of resistors configured to divide a predetermined voltage; a plurality of MOS transistors configured to divide a voltage generated across one resistor of the plurality of resistors; a control circuit configured to control a connection between the one resistor and the plurality of MOS transistors so as to supply to the plurality of MOS transistors the voltage generated across the one resistor; and a gate potential generating circuit configured to generate a plurality of mutually different gate potentials and supply the plurality of generated gate voltages, respectively, to a plurality of gates of the plurality of MOS transistors so as to make the resistance values of MOS resistance of the plurality of MOS transistors equal to each other.

According to one aspect of the present invention, there is provided a semiconductor device including a resistor-string digital/analog converter circuit converting a digital signal into an analog signal, the semiconductor device including: an input unit configured to receive the digital signal; a plurality of resistors configured to divide a predetermined voltage; a plurality of MOS transistors configured to divide a voltage generated across one resistor of the plurality of resistors; a gate potential generating circuit configured to generate a plurality of mutually different gate potentials and supply the plurality of generated gate voltages, respectively, to a plurality of gates of the plurality of MOS transistors so as to make the resistance values of MOS resistance of the plurality of MOS transistors equal to each other; a control logic circuit configured to control a connection between the one resistor and the plurality of MOS transistors so as to supply the voltage generated across the one resistor to the plurality of MOS transistors by selecting, according to higher-order bits of the digital signal, the one resistor and connecting both ends of the one resistor selected, respectively, to the plurality of MOS transistors; and an output unit configured to output as the analog signal a source voltage or a drain voltage of one MOS transistor of the plurality of MOS transistors which is selected according to lower-order bits of the digital signal.

DETAILED DESCRIPTION OF THE
EMBODIMENTS OF THE INVENTION

Embodiments of the present invention will be described below with reference to the drawings.

First Embodiment

Figure 1:
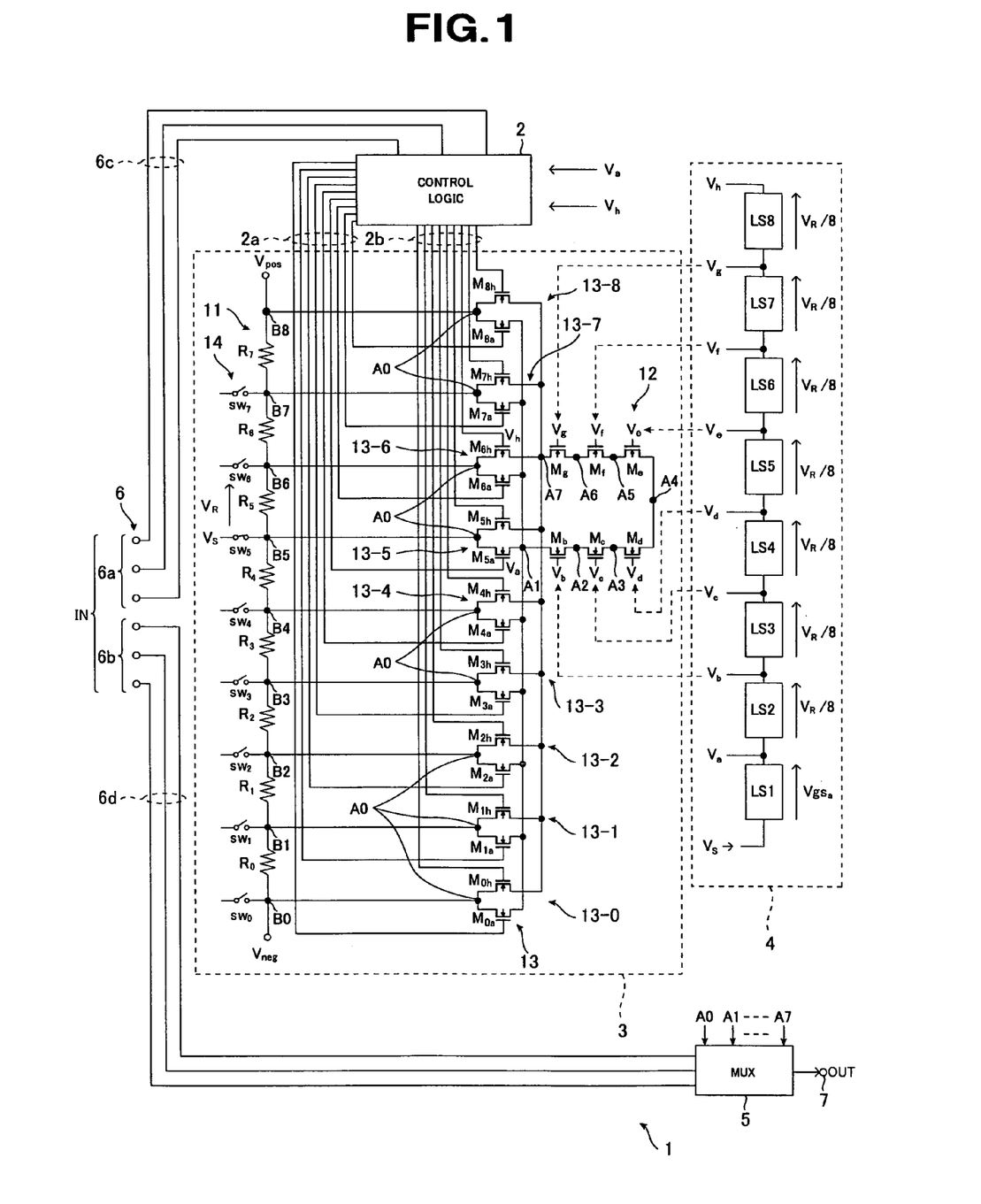
FIG. 1 is a circuit diagram showing a configuration of a resistor-string D/A converter circuit according to a first embodiment of the present invention.

FIG. 1 is a circuit diagram showing a configuration of a resistor-string D/A converter circuit included in a semiconductor device, according to a first embodiment. A D/A converter circuit 1 includes a control logic circuit 2 acting as a control circuit, a voltage dividing circuit 3 including a plurality of resistors and a plurality of MOS transistors, a gate potential generating circuit 4, and a multiplexer (MUX) 5 acting as an output voltage selection unit configured to select an output voltage. It should be noted that in the present embodiment, to simplify the description, there will be described an exemplary D/A converter circuit in which higher-order 3 bits and lower-order 3 bits of a digital signal of 6 bits are converted into an analog signal by use of the resistors and the MOS transistors, respectively.

The D/A converter circuit 1 further includes an input unit 6 configured to receive a digital signal IN to be converted into an analog signal and an output unit 7 configured to output the analog signal. A signal of higher-order 3 bits (hereinafter referred to as "higher-order bit 6a") of digital signal IN from the input unit 6 is supplied to the control logic circuit 2 via a signal line 6c; a signal of lower-order 3 bits (hereinafter referred to as "lower-order bit 6b") is supplied to the multiplexer 5 via a signal line 6d. As described later, higher-order bit 6a is used to select which dividing voltage by the plurality of resistors to use, and lower-order bit 6b is used to select which dividing voltage by the plurality of MOS transistors to use.

In the D/A converter circuit 1, a predetermined processing described later is performed and an output signal OUT corresponding to digital signal IN is thereby outputted from the multiplexer 5.

Upon receipt of the digital signal of higher-order bit 6a, the control logic circuit 2 outputs various necessary selection signals at predetermined timing. The selection signals outputted from the control logic circuit 2 will be described later.

The voltage dividing circuit 3 includes a resistance string unit constituted of a plurality of resistors connected in series, i.e., a resistor group 11. Here, the resistor group 11 includes eight resistors $R_0$ to $R_7$. A predetermined voltage is applied across the resistor group 11; higher voltage $V_{pos}$ from a high potential power source is supplied to the one end, and lower voltage $V_{neg}$ from a low potential power source is supplied to the other end. The eight resistors $R_0$ to $R_7$ each have the same resistance value, and when voltage $V_{pos}$ and voltage $V_{neg}$ are supplied across the resistor group 11, the same voltage $V_R$ being a dividing voltage occurs across each resistor. A dividing voltage corresponding to digital signal IN is selected from among the voltage between both-end nodes of the resistor group 11 and voltages of plurality of connection nodes disposed between the resistors.

The voltage dividing circuit 3 further includes a MOS transistor group as interpolation resistors (hereinafter referred to as interpolation use MOS transistor group) 12 constituting interpolation resistance. The interpolation use MOS transistor group 12 includes a plurality of MOS transistors $M_b$, $M_c$, $M_d$, $M_e$, $M_f$ and $M_g$. The plurality of MOS transistors $M_b$, $M_c$, $M_d$, $M_e$, $M_f$ and $M_g$ are connected to in series so that the source and drain are mutually connected.

The voltage dividing circuit 3 includes a connection switch group for selecting the connection to the interpolation resistors (hereinafter referred to as interpolation resistance connection use connection switch group) 13 for selecting which of the resistors of the resistor group 11 is connected to the MOS interpolation resistance. The interpolation resistance connection use connection switch group 13 is constituted of a plurality of connection switches for connecting to the interpolation use MOS transistor group 12, one of the resistors of the resistor group 11. That is, one resistor is selected by the connection switch group 13 to supply a voltage generated across the resistor to the interpolation use MOS transistor group 12. A plurality of connection switches 13-0 to 13-8 (hereinafter, simply referred to as "13-k" (k being any of 0 to 8)) constituting the connection switch group 13 are each composed of a pair of N channel MOS transistors. Each of the plurality of connection switches 13-k of the connection switch group 13 are connected to a respective end of the resistor group 11.

All the pairs of N channel MOS transistors are MOS transistors $M_{0a}$ and $M_{0h}$, $M_{1a}$ and $M_{1h}$, $M_{2a}$ and $M_{2h}$, $M_{3a}$ and $M_{3h}$, $M_{4a}$ and $M_{4h}$, $M_{5a}$ and $M_{5h}$, $M_{6a}$ and $M_{6h}$, $M_{7a}$ and $M_{7h}$, and $M_{8a}$ and $M_{8h}$.

The source of N channel MOS transistor $M_a$ and the drain of N channel MOS transistor $M_h$ of each pair are connected to each other. Connection nodes A0 being the connection points therebetween are connected to the both end nodes of the resistor group 11 and connection nodes B0 to B8 between each resistor, respectively.

More specifically, to the connection node B0 of the resistor $R_0$ connected to voltage $V_{neg}$, there are connected the source of the N channel MOS transistor $M_{0a}$ and the drain of the MOS transistor $M_{0h}$, the transistors $M_{0a}$ and $M_{0h}$ constituting one pair. To the connection node B1 between the resistors $R_0$ and $R_1$, there are connected the source of the N channel MOS transistor $M_{1a}$ and the drain of the MOS transistor $M_{1h}$, the transistors $M_{1a}$ and $M_{1h}$ constituting one pair. In like manner, to the connection nodes between each resistor, there are connected the source of one N channel MOS transistor and the drain of the other N channel MOS transistor, the two transistors constituting one pair. To the connection node B8 of the resistor $R_7$ connected to voltage $V_{pos}$, there are connected the source of the N channel MOS transistor $M_{8a}$ and the drain of the MOS transistor $M_{8h}$, the transistors $M_{8a}$ and $M_{8h}$ constituting one pair.

The drains of the MOS transistors $M_{0a}$, $M_{1a}$, $M_{2a}$, $M_{3a}$, $M_{4a}$, $M_{5a}$, $M_{6a}$, $M_{7a}$ and $M_{8a}$ each being one MOS transistor constituting each connection switch 13-k are connected to each other. A common connection node A1 to which each of the above drains are connected is connected to the source of the MOS transistor Mb. Also, the sources of the MOS transistors $M_{0h}$, $M_{1h}$, $M_{2h}$, $M_{3h}$, $M_{4h}$, $M_{5h}$, $M_{6h}$, $M_{7h}$, and $M_{8h}$ each being the other MOS transistor constituting each connection switch 13-k are connected to each other. A common connection node A7 to which each of the above sources are connected is connected to the drain of the MOS transistor $M_g$.

Also, the connection nodes A1 to A6 on the source side of the plurality of MOS transistors $M_b$, $M_c$, $M_d$, $M_e$, $M_f$ and $M_g$ and the above connection nodes A0 and A7 are connected to an input unit of the multiplexer 5.

It should be noted that the plurality of these MOS transistors $M_b$, $M_c$, $M_d$, $M_e$, $M_f$ and $M_g$ and the MOS transistors of the connection switch group 13 constitute the interpolation resistance with respect to the resistor group 11. That is, the MOS transistors $M_{0a}$ to $M_{8a}$ and $M_{0h}$ to $M_{8h}$, constituting the connection switch group are each a switch for selecting a connection between the MOS transistor group 12 and the resistor group 11; MOS resistance being a resistance when turned on (so-called ON resistance) acts as part of the interpolation resistance.

Also, the voltage dividing circuit 3 includes a connection switch group for selecting the potential to be monitored (hereinafter referred to as potential monitoring use connection switch group) 14 for the purpose of supplying each connection node in the lower potential side of each resistor of the resistor group 11 to the gate potential generating circuit 4 described later. The potential monitoring use connection switch group 14 includes a plurality of connection switches $sw_0$ to $sw_7$. When one connection switch $sw_i$ ($i$ being any of 0 to 7) of the connection switch group 14 is selected to be turned on and the other switches are turned off, potential $V_s$ generated at one end in the lower potential side of a resistor selected from among the plurality of resistors is supplied to the input terminal of the gate potential generating circuit 4. A selection signal for selecting one from among the plurality of connection switches $sw_0$ to $sw_7$ is supplied from the control logic circuit 2 via a signal line not shown.

The gate potential generating circuit 4 has a plurality of level shift circuits LS1 to LS8 connected in series. To one end on the lower potential side of the plurality of level shift circuits LS1 to LS8, there is supplied potential $V_s$ of a connection node connected when one connection switch $sw_i$ is selected from among the connection switch group 14 and turned on. For example, in FIG. 1, when the connection switch $sw_5$ is selected to be turned on, a potential of the connection node B5 between the resistors $R_4$ and $R_5$ is supplied to the input terminal of the plurality of level shift circuits LS1 to LS8.

Potential $V_s$ supplied to the input terminal of the plurality of level shift circuits LS1 to LS8 is shifted by predetermined potential $V_{LS1}$ by the first-stage level shift circuit LS1. The level shift circuit LS1 supplies to the following-stage level shift circuit LS2, potential $V_a$ being the result of being shifted by predetermined potential $V_{LS1}$ from potential $V_s$. The level shift circuit LS2 shifts the received potential $V_a$ by predetermined potential $V_{LS2}$ and supplies to the following-stage level shift circuit LS3, potential $V_b$ being the result of being shifted by predetermined potential $V_{LS2}$ from potential $V_a$. In like manner, each level shift circuit shifts a potential being the result of being level-shifted at a previous stage by predetermined potential $V_{LS3}$, $V_{LS4}$, $V_{LS5}$, $V_{LS6}$, $V_{LS7}$ respectively and then supplies to a following-stage level shift circuit, the potential $V_c$, $V_d$, $V_e$, $V_f$, $V_g$ being the result of being shifted. The final-stage level shift circuit LS8 outputs potential $V_h$ being the result of being shifted by predetermined potential $V_{LS8}$. Potentials $V_{LS1}$ to $V_{LS8}$ are supplied to respective gates of predetermined MOS transistors, each potential being a voltage required for turning on the respective MOS transistors.

As described above, the level shift circuits LS1 to LS8 each level-shift a received potential by a predetermined potential and generates potentials $V_a$ to $V_h$ different from each other, respectively.

The output potential $V_a$ of the first-stage level shift circuit LS1 and the output potential $V_h$ of the final-stage level shift circuit LS8 are supplied to the control logic circuit 2. Potential $V_a$ being the result of being level-shifted is supplied to one gate of one MOS transistor $M_{0a}$ to $M_{8a}$ of the connection switch 13-$k$ selected by the control logic circuit 2. The potential $V_h$ being the result of being level-shifted is supplied to one gate of the other MOS transistor $M_{0h}$ to $M_{8h}$ of the connection switch 13-$k$ selected by the control logic circuit 2. The MOS transistors $M_{0a}$ to $M_{8a}$ and $M_{0h}$ to $M_{8h}$ not selected receive at the gate thereof no potential for turning on each MOS transistor and are in an OFF state.

Potentials $V_b$ to $V_g$ being the result of being level-shifted are supplied to the gate of the plurality of MOS transistors $M_b$ to $M_g$, respectively.

It should be noted that, by use of the control logic circuit 2, there are set and preliminarily determined a switch $sw_i$ to be turned on according to higher-order bit 6a and a combination of MOS transistors to be supplied with potentials $V_a$ and $V_h$ generated in the gate potential generating circuit 4.

As a result, the above potentials are supplied to the gate of the plurality of MOS transistors $M_{5a}$, $M_b$ to $M_g$, and $M_{6h}$, respectively, so the MOS transistors are turned on. According to the MOS transistors turned on, voltage $V_R$ applied to the resistor $R_5$ of the resistor group 11 is divided by the eight MOS transistors. With potential $V_s$ of the connection node being a lower potential side reference potential, voltage $V_R$ is divided by eight.

The eight dividing voltages being the result of voltage dividing by the eight MOS transistors appear at the connection nodes A0 to A7. The eight voltages of the connection nodes A0 to A7 are supplied as the input voltage to the multiplexer 5 via lines not shown. According to lower-order bit 6b, the multiplexer 5 outputs as an analog signal, one of the voltages of the connection nodes A0 to A7.

The connection node A0 is the same as any of the connection nodes B0 to B8. Thus, as the voltage of the connection node A0, one is selected from among the potentials of the connection nodes B0 to B8 and supplied to the multiplexer 5.

Next, the operation of the circuit shown in FIG. 1 will now be described.

When a digital signal is supplied to the input unit 6, higher-order bit 6a and lower-order bit 6b are supplied to the control logic circuit 2 and the multiplexer 5, respectively.

According to higher-order bit 6a, the control logic circuit 2 outputs a selection signal for selecting one connection switch $sw_i$ to be turned on from among the connection switch group 14. Here, for example, as shown in FIG. 1, the connection switch $sw_5$ is selected to be turned on and the other connection switches are in an OFF state. Voltages $V_{pos}$ to $V_{neg}$ are applied across the resistor group 11 and the connection switch $sw_5$ has been selected, so potential $V_s$ of the connection node B5 connected when the connection switch $sw_5$ of the potential monitoring use connection switch group 14 is selected and turned on, is supplied to the input terminal of the level shift circuit LS1. The connection switches other than $sw_5$ are in an OFF state. Here, as shown in FIG. 1, the connection switch $sw_5$ is selected and turned on, and potential $V_s$ is equal to 5/8 ($V_{pos}$−$V_{neg}$).

When potential $V_s$ is supplied to the level shift circuit LS1, as described above, the level shift circuit LS1 generates potential $V_a$ being the result of being level-shifted by predetermined potential $V_{LS1}$. The level shift circuit LS2 generates a potential being the result of being level-shifted by predetermined potential $V_{LS2}$ from potential $V_a$. In like manner, the level shift circuits LS3 to LS8 also generate a potential being the result of being level-shifted by predetermined potentials $V_{LS3}$ to $V_{LS8}$, respectively, from a received potential.

Potential $V_a$ being the result of being level-shifted and outputted from the level shift circuit LS1 is supplied to the control logic circuit 2. The control logic circuit 2 selects, according to higher-order bit 6a received, one MOS transistor of the connection switch 13-k of the interpolation resistance connection use connection switch group 13 to which received potential $V_a$ is to be supplied, and supplies potential $V_a$ to the gate of the selected MOS transistor. Here, potential $V_a$ is supplied to the gate of the MOS transistor $M_{5a}$ via one of the signal lines 2a. Potential $V_a$ is a voltage required for turning on the MOS transistor $M_{5a}$.

Potentials $V_b$ to $V_g$ outputted from the level shift circuits LS2 to LS7 are supplied to respective gates of the plurality of MOS transistors $M_b$ to $M_g$. Potentials $V_b$ to $V_g$ also turn on the plurality of MOS transistors $M_b$ to $M_g$, respectively.

Potential $V_h$ being the result of being level-shifted and outputted from the level shift circuit LS8 is supplied to the control logic circuit 2. The control logic circuit 2 selects, according to higher-order bit 6a received, the other MOS transistor of the connection switch 13-k of the connection switch group 13 to which received potential $V_h$ is to be supplied, and supplies potential $V_h$ to the gate of the selected MOS transistor. Here, potential $V_h$ is supplied to the gate of the MOS transistor $M_{6h}$ via one of the signal lines 2b. Potential $V_h$ turns on the MOS transistor $M_{6h}$.

Among the interpolation resistance connection use connection switch group 13, the gate of MOS transistor not selected receives no potential required for turning on at each gate, so the MOS transistor is in an OFF state. More specifically, the MOS transistors $M_{5a}$ and $M_{6h}$ selected are turned on and the other MOS transistors are all in an OFF state, whereby the MOS interpolation resistance is connected to both ends of the resistor $R_5$.

Here, an example is described in which the control logic circuit 2 supplies, according to higher-order bit 6a, a selection signal to the connection switch $sw_5$ to be turned on from among the connection switch group 14, and potentials $V_a$ and $V_h$ are supplied to the gate of the MOS transistors $M_{5a}$ and $M_{6h}$, respectively. As described above, in the control logic circuit 2, according to higher-order bit 6a received, there are set a connection switch preliminarily selected, and the MOS transistors to be supplied, respectively, with potentials $V_a$ and $V_h$.

As a combination of MOS transistors in the connection switch group 13 with respect to the connection switch $sw_i$, there are a combination of $M_{0a}$ and $M_{1h}$ with respect to the connection switch $sw_0$, a combination of $M_{1a}$ and $M_{2h}$ with respect to the connection switch $sw_1$, a combination of $M_{2a}$ and $M_{3h}$ with respect to the connection switch $sw_2$, a combination of $M_{3a}$ and $M_{4h}$ with respect to the connection switch $sw_3$, a combination of $M_{4a}$ and $M_{5h}$ with respect to the connection switch $sw_4$, a combination of $M_{5a}$ and $M_{6h}$ with respect to the connection switch $sw_5$, a combination of $M_{6a}$ and $M_{7h}$ with respect to the connection switch $sw_6$, and a combination of $M_{7a}$ and $M_{7h}$ with respect to the connection switch $sw_7$.

To the gate of each MOS transistor selected from among the plurality of MOS transistors $M_{0a}$ to $M_{8a}$ and $M_{0h}$ to $M_{8h}$, and to each gate of the MOS transistors $M_b$ to $M_g$, there are supplied potentials which each turn on the MOS transistors and which are the result of being level-shifted on the basis of the potential of the selected connection node, in this instance, of the connection node B5.

In the gate potential generating circuit 4, there is generated potential $V_a$ being the result of being level-shifted by voltage ($V_{gsa}$) required for turning on the MOS transistor $M_5$ from potential $V_s$ and further, there are generated potentials $V_b$ to $V_h$ being the result of being level-shifted by a value obtained by dividing voltage $V_R$ applied to the resistor $R_5$ by eight. The generated potentials are supplied as the gate potential of the MOS transistors $M_b$ to $M_g$ and $M_{6h}$, respectively. In the present embodiment, since 3 bits are used, voltage $V_R$ is divided by eight, but in the case of n bits, voltage $V_R$ is divided by $2^n$.

As a result, each drain-source voltage $V_{ds}$ of the MOS transistors acting as the interpolation resistance becomes ideally constant ($V_R/8$). This means that the source potentials of each MOS transistor are different from each other by $V_R/8$. Thus, in the circuit configuration, the gate potentials of the MOS transistors acting as the interpolation resistance are each level-shifted by $V_R/8$, and the gate-source voltages ($V_{gs}$) of all the MOS transistors are made equal to each other, whereby linearity of D/A conversion is improved.

More specifically, on the basis of a dividing voltage determined by the selected connection switch $sw_i$ of the connection switch group 14 and generated by the plurality of resistors 111, a plurality of gate potentials different from each other are supplied to the gate of the respective MOS transistors so that the resistance values of MOS resistance of the respective MOS transistors are equal to each other.

Consequently, the gate-source voltages ($V_{gs}$) of each MOS transistor are equal to each other, and thus each MOS resistance value is uniform. As a result, D/A conversion is performed with excellent linearity.

Figure 2:
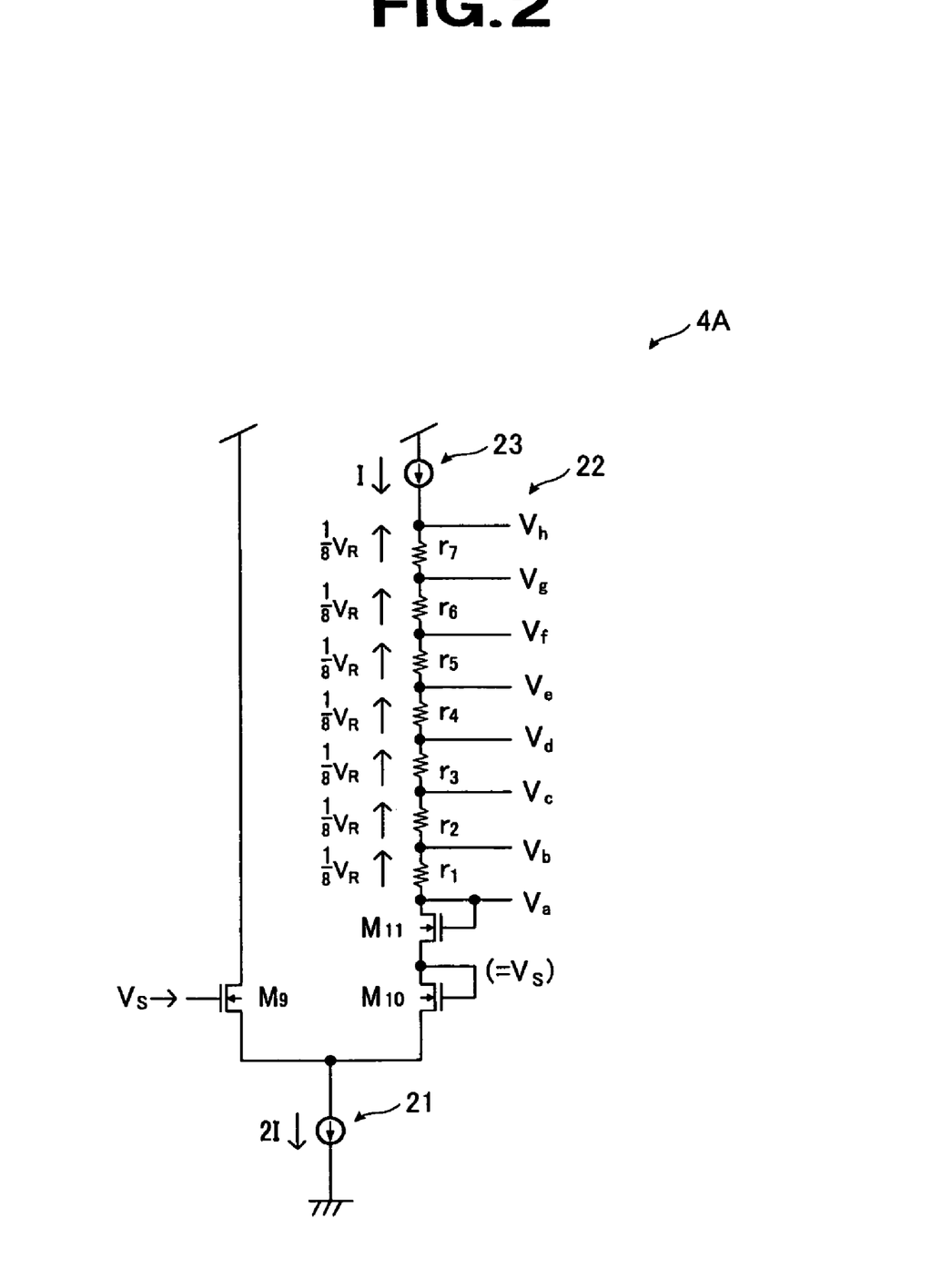
FIG. 2 is a circuit diagram showing an exemplary gate potential generating circuit according to the first embodiment.

The gate potential generating circuit 4 may have any circuit configuration as long as it implements the above function. FIG. 2 shows one example thereof. FIG. 2 is a circuit diagram showing an exemplary gate potential generating circuit. The gate potential generating circuit 4A shown in FIG. 2 includes a constant current source 21 and an N channel MOS transistor $M_9$ whose source is connected to the constant current source 21. The gate potential generating circuit 4A further includes a resistor group 22 constituted of seven resistors $r_1$ to $r_7$ connected in series. A series circuit having a constant current source 23, the resistor group 22 and two N channel MOS transistors $M_{10}$ and $M_{11}$ connected in series is connected in parallel to the MOS transistor $M_9$. The respective sources of the MOS transistors $M_9$ and $M_{10}$ are connected to the constant current source 21. Thus the MOS transistors $M_9$ and $M_{10}$ constitute a differential pair. The constant current source 21 supplies current 2I. The constant current source 23 is connected to one end of the resistor group 22, and supplies current I. Each resistor of the resistor group 22 functions as a level shift circuit.

More specifically, the drain of the MOS transistor $M_{11}$ is connected to one end of the resistor group 22, in this instance, the resistor $r_1$. The drain of the MOS transistor $M_{10}$ is connected to the source of the MOS transistor $M_{11}$. The MOS transistors $M_{10}$ and $M_{11}$ are diode-connected to each other (i.e., the gate and drain are connected).

The MOS transistors $M_9$ and $M_{10}$ are equal in gate length and gate width. The resistors $r_1$ to $r_7$ of the resistor group 22 have the same resistance value. The resistance value of each resistor is assumed to be $r=(V_R/8)/I$. From both end nodes of the resistor group 22 and connection nodes between each resistor, as shown in FIG. 2, there are extracted the above described potentials $V_b$ to $V_h$. Potentials $V_b$ to $V_h$ are supplied to the gate of the respective MOS transistors in FIG. 1 directly or via the control logic circuit 2.

Next, the operation of the gate potential generating circuit 4A will now be described.

When potential $V_s$ is supplied from the voltage dividing circuit 3 to the gate of the MOS transistor $M_9$, the MOS transistors $M_9$ and $M_{10}$ operate as a differential pair. The same amount of current (i.e., current quantity I) flows through the MOS transistors $M_9$ and $M_{10}$, and the source potentials of these transistors are equal. Consequently, the gate voltage and drain voltage of the MOS transistor $M_{10}$ are equal to potential $V_s$.

The gate potential and drain potential of the MOS transistor $M_{11}$ connected in series to the MOS transistor $M_{10}$ become gate potential $V_a$ which turns on a MOS transistor having source potential $V_s$ (in the example of FIG. 1, MOS transistor $M_5$).

Then, with potential $V_a$ being a lower side reference potential, from the connection nodes between each resistor of the resistor group 22, there are generated potentials $V_b$ to $V_g$ in order of lower potential. At the higher-side end of the resistor group 22, there is generated potential $V_h$. As described above, since the resistance value of each resistor of the resistor group 22 is set to $r=(V_R/8)/I$, potentials $V_b$ to $V_h$ are each the result of being level-shifted by potential $V_R/8$ from potential $V_a$.

Consequently, according to the circuit configuration of FIG. 2, the value of potential $V_a$ varies according to potential $V_s$, and the value of voltage $V_{gs}$ of the MOS transistor connected to potential $V_s$ is held at a constant value at all times. Thus, the variation in MOS resistance value (body effect) ascribable to switching of interpolation resistance connection location is reduced. Further, since potentials $V_b$ to $V_h$ being the result of being level-shifted by $V_R/8$ from potential $V_a$ are supplied to the gate of the respective MOS transistors, non-uniformity of resistance value of each MOS resistance acting as MOS interpolation resistance is also reduced, and linearity of D/A conversion is improved.

Second Embodiment

Figure 3:
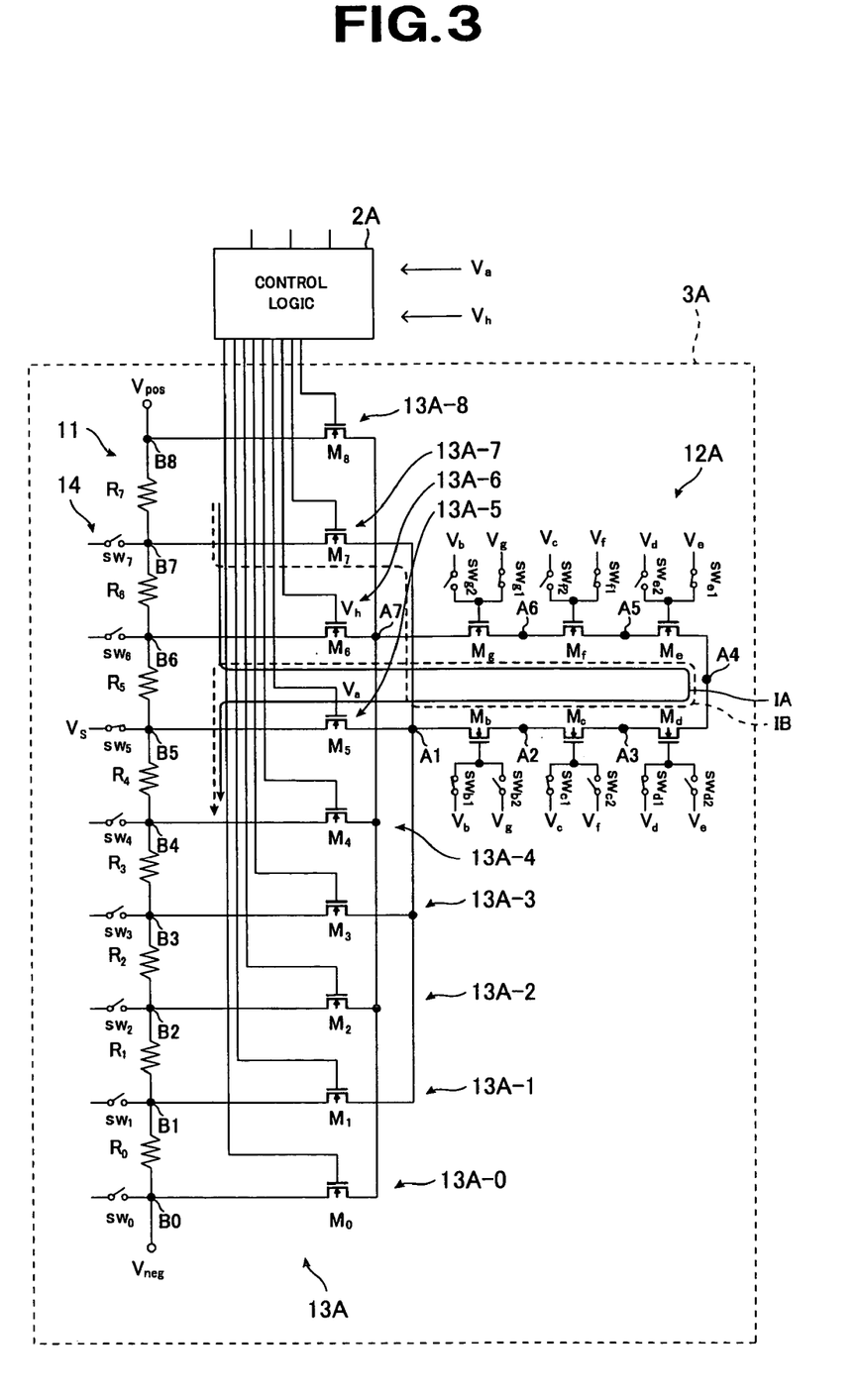
FIG. 3 is a partial circuit diagram of a resistor-string D/A converter circuit according to a second embodiment of the present invention.
Figure 4:
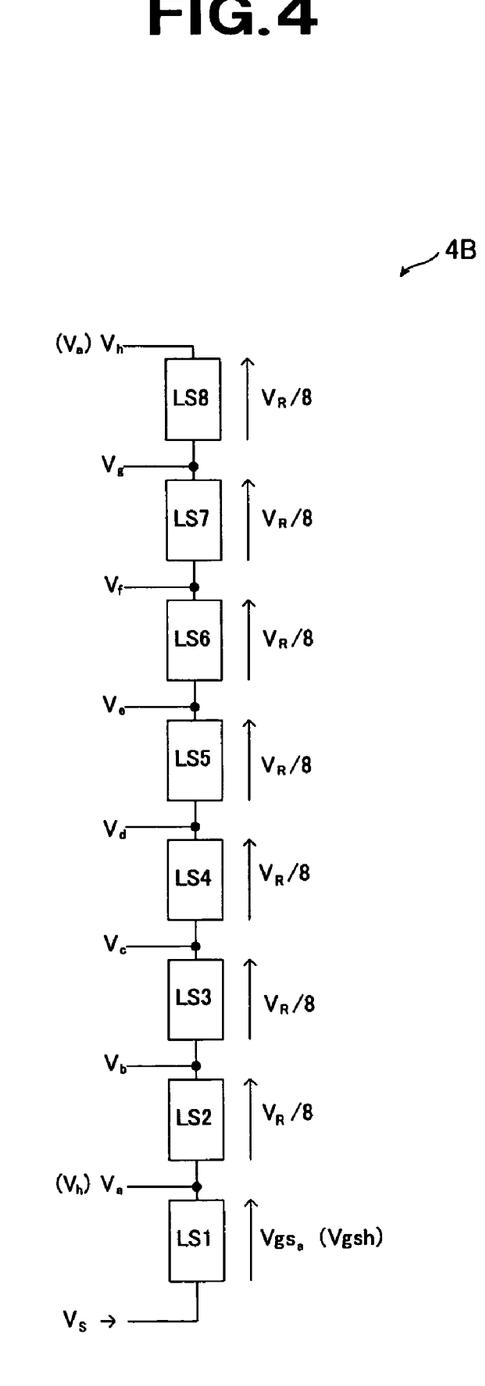
FIG. 4 is a circuit diagram of a gate potential generating circuit according to the second embodiment of the present invention.

FIGS. 3 and 4 are circuit diagrams for explaining a configuration of a resistor-string D/A converter circuit according to a second embodiment of the present invention. FIG. 3 is a partial circuit diagram of a control logic circuit 2A and a voltage dividing circuit 3A including a plurality of resistors and a plurality of MOS transistors of the resistor-string D/A converter circuit according to the second embodiment. FIG. 4 is a circuit diagram of a gate potential generating circuit 4B. It should be noted that in the present embodiment, again, to simplify the description, there will be described an exemplary D/A converter circuit in which a digital signal of 6 bits is converted into an analog signal. Also, the same reference characters are applied to constituent elements corresponding to those of the first embodiment, and an explanation thereof is omitted.

The voltage dividing circuit 3A includes an interpolation use MOS transistor group 12A constituting an interpolation resistance. The interpolation use MOS transistor group 12A includes a plurality of MOS transistors $M_b$, $M_c$, $M_d$, $M_e$, $M_f$ and $M_g$. The plurality of MOS transistors $M_b$, $M_c$, $M_d$, $M_e$, $M_f$ and $M_g$ are connected in series so that the source and drain are mutually connected.

To each gate of the plurality of MOS transistors $M_b$, $M_c$, $M_d$, $M_e$, $M_f$ and $M_g$, there are connected two switches to allow two potentials to be selectively received. To the MOS transistor $M_b$, there are connected two switches $sw_{b1}$ and $sw_{b2}$. To the MOS transistor $M_c$, there are connected two switches $sw_{c1}$ and $sw_{c2}$. In like manner, to the MOS transistors $M_d$, $M_e$, $M_f$ and $M_g$, there are connected two switches $sw_{d1}$ and $sw_{d2}$, $sw_{e1}$ and $sw_{e2}$, $sw_{f1}$ and $sw_{f2}$, and $sw_{g1}$ and $sw_{g2}$, respectively.

Further, the voltage dividing circuit 3A includes an interpolation resistance connection use connection switch group 13A for selecting which of the resistors of the resistor group 11 is connected to the MOS interpolation resistance. The interpolation resistance connection use connection switch group 13A is constituted of a plurality of connection switches for connecting to the interpolation use MOS transistor group 12, one of the resistors of the resistor group 11. The plurality of connection switches 13A-0 to 13A-8 (hereinafter, simply referred to as "13A-k" (k being any of 0 to 8)) of the connection switch group 13A are each composed of one N channel MOS transistor.

In the first embodiment, with respect to the both end nodes of the resistor group 11 and the connection nodes between each resistor, the connection switches 13-k for interpolation resistance connection each use two MOS transistors. However, in the present embodiment, the polarity (i.e., the flowing current direction) of the interpolation use MOS transistor group 12A when connected is switched. Thus, the connection switches 13A-k of the interpolation resistance connection use connection switch group 13A each use only one MOS transistor.

Consequently, due to the switching of the polarity of the interpolation use MOS transistor group 12A when connected, to each gate of the interpolation use MOS transistor group 12A, there are provided the aforementioned two switches $sw_{j1}$ and $sw_{j2}$ (j being any of b, c, d, e, f and g) acting as the switch for changing the gate voltage according to the polarity thereof.

The connection switches 13A-k for interpolation resistance connection are MOS transistors $M_0$ to $M_8$, respectively, and act as the switch for changing the connection between the both end nodes of the resistor group 11 and a plurality of connection nodes between each resistor and the MOS transistors $M_b$ to $M_g$ being MOS interpolation resistances. The connection switches 13A-k themselves also act as part of the MOS interpolation resistance.

The gate potential generating circuit 4B of FIG. 4 has the same configuration as that of the gate potential generating circuit 4 of FIG. 1.

The operation will be described below when the interpolation resistance is connected to the resistor $R_5$. In this case, the MOS transistors $M_b$ and $M_g$ are turned on, and the other MOS transistors for interpolation resistance connection are all turned off. Consequently, the interpolation resistance is connected to both ends of the resistor $R_5$.

Here, an example is described in which the control logic circuit 2A supplies, according to higher-order bit 6a, a selection signal to the connection switch $sw_5$ to be turned on from among the connection switch group 14, and potentials $V_a$ and $V_h$ are supplied to the gates of the MOS transistors $M_5$ and $M_6$, respectively. As described above, in the control logic circuit 2A, according to higher-order bit 6a received, there are set a connection switch preliminarily selected and the MOS transistors to be supplied, respectively, with potentials $V_a$ and $V_h$.

As a combination of MOS transistors to be supplied with potentials $V_a$ and $V_h$, in the connection switch group 13 with respect to the connection switch $sw_j$, there are a combination of $M_0$ and $M_1$ with respect to the connection switch $sw_0$, a combination of $M_1$ and $M_2$ with respect to the connection switch $sw_1$, a combination of $M_2$ and $M_3$ with respect to the connection switch $sw_2$, a combination of $M_3$ and $M_4$ with respect to the connection switch $sw_3$, a combination of $M_4$ and $M_5$ with respect to the connection switch $sw_4$, a combination of $M_5$ and $M_6$ with respect to the connection switch $sw_5$, a combination of $M_6$ and $M_7$ with respect to the connection switch $sw_6$, and a combination of $M_7$ and $M_8$ with respect to the connection switch $sw_7$.

First, among the connection switches $sw_0$ to $sw_7$, the connection switch $sw_5$ is turned on, and a potential at the lower potential side end of the resistor $R_5$, i.e., the source potential $V_s$ of the MOS transistor $M_5$ is supplied to the input terminal of the gate potential generating circuit 4B of FIG. 4. That is, the source potential $V_s$ of the MOS transistor $M_5$ is monitored by the gate potential generating circuit 4B.

In the gate potential generating circuit 4B, there is generated potential $V_a$ being the result of being level-shifted by a voltage ($V_{gsa}$) required for turning on the MOS transistor $M_5$ from potential $V_s$. Potential $V_a$ is supplied to the gate of the MOS transistor $M_5$ via the control logic circuit 2A.

Further, in the gate potential generating circuit 4B, there are generated potentials $V_b$ to $V_h$ being the result of being level-shifted by a value obtained by dividing voltage $V_R$ applied across the resistor $R_5$ by eight from the value of potential $V_a$.

The control logic circuit 2A turns on the connection switches $sw_{b1}$ to $sw_{g1}$ and turns off $sw_{b2}$ to $sw_{g2}$, whereby potentials $V_b$ to $V_g$ are supplied to the gate of the MOS transistors $M_b$ to $M_g$, respectively. Also, potential $V_h$ is supplied to the gate of the MOS transistor $M_6$ via the control logic circuit 2A. As a result, in FIG. 3, current flows in a direction indicated by the solid line IA.

As a result, the above potentials are supplied to the gate of the plurality of MOS transistors $M_5$, $M_b$ to $M_g$, and $M_6$, respectively, so the MOS transistors are turned on. Due to the MOS transistors being turned on, voltage $V_R$ applied to the resistor $R_5$ of the resistor group 11 is divided by the eight MOS transistors. With potential $V_s$ of the connection node being a lower potential side reference potential, voltage $V_R$ is divided by eight.

At this time, the value of potential $V_a$ varies according to the lower side reference potential $V_s$, and potentials $V_b$ to $V_h$ resulted from being level-shifted by $V_R/8$ from potential $V_a$ are supplied to the gate of the MOS transistors $M_b$ to $M_g$ and $M_6$, respectively.

When the interpolation resistance is connected to the resistor $R_6$, the MOS transistors $M_6$ and $M_7$ are turned on, and the other MOS transistors for interpolation resistance connection are all turned off, whereby the interpolation resistance is connected to both ends of the resistor $R_6$.

The polarity of interpolation resistance connection is changed, so potentials $V_h$ and $V_a$ are supplied to the gate of the MOS transistors $M_6$ and $M_7$, respectively, and when the switches $sw_{b1}$ to $sw_{g1}$ are turned off and the switches $sw_{b2}$ to $sw_{g2}$ are turned on, potentials $V_b$ to $V_h$ are supplied to the gate of the MOS transistors $M_b$ to $M_g$, respectively. As a result, in FIG. 3, current flows in a direction indicated by the dotted line IB. Potential $V_h$ is the result of being level-shifted by a voltage ($V_{gsh}$) required for turning on the MOS transistor $M_6$ from potential $V_s$.

As a result, the above potentials are supplied to the gates of the plurality of MOS transistors $M_6$, $M_g$ to $M_b$, and $M_7$, respectively, so that the MOS transistors are turned on. Due to the MOS transistors being turned on, voltage $V_R$ applied to the resistor $R_6$ of the resistor group 11 is divided by the eight MOS transistors. With potential $V_s$ of the connection node being a lower potential side reference potential, voltage $V_R$ is divided by eight.

At this time, the value of potential $V_h$ varies according to the lower side reference potential $V_s$, and potentials $V_b$ to $V_g$ and $V_a$ resulted from being level-shifted by $V_R/8$ from potential $V_h$ are supplied to the gate of the MOS transistors $M_g$ to $M_b$ and $M_7$, respectively.

It should be noted that the ON/OFF control of the switches $sw_{b1}$ to $sw_{g1}$ and $sw_{b2}$ to $sw_{g2}$ is performed by the control logic circuit 2A. The control logic circuit 2A changes, according to selection of a resistor of the resistor group 11, the polarity of connection of the interpolation use MOS transistor group 12A. In the case of FIG. 3, when interpolation is performed with respect to voltage across the resistors $R_1$, $R_3$, $R_5$ or $R_7$, the switches $sw_{b1}$ to $sw_{g1}$ are turned on and the switches $sw_{b2}$ to $sw_{g2}$ are turned off; when interpolation is performed with respect to voltage across the resistors $R_0$, $R_2$, $R_4$ or $R_6$, the switches $sw_{b1}$ to $sw_{g1}$ are turned off and the switches $sw_{b2}$ to $sw_{g2}$ are turned on.

As described above, according to the present embodiment, also, nonuniformity of resistance value of each MOS resistance acting as MOS interpolation resistance is reduced and linearity of D/A conversion is improved. Further, the polarity of connection of the interpolation use MOS transistor group 12A is changed depending on a resistor selected from among the resistor group 11, so the connection switches 13A-k of the interpolation resistance connection use connection switch group 13A each use only one MOS transistor, thus simplifying the circuit configuration.

It should be noted that in the present embodiment, instead of the gate potential generating circuit 4B of FIG. 4, the gate potential generating circuit 4 of FIG. 2 may be used.

Third Embodiment

Figure 5:
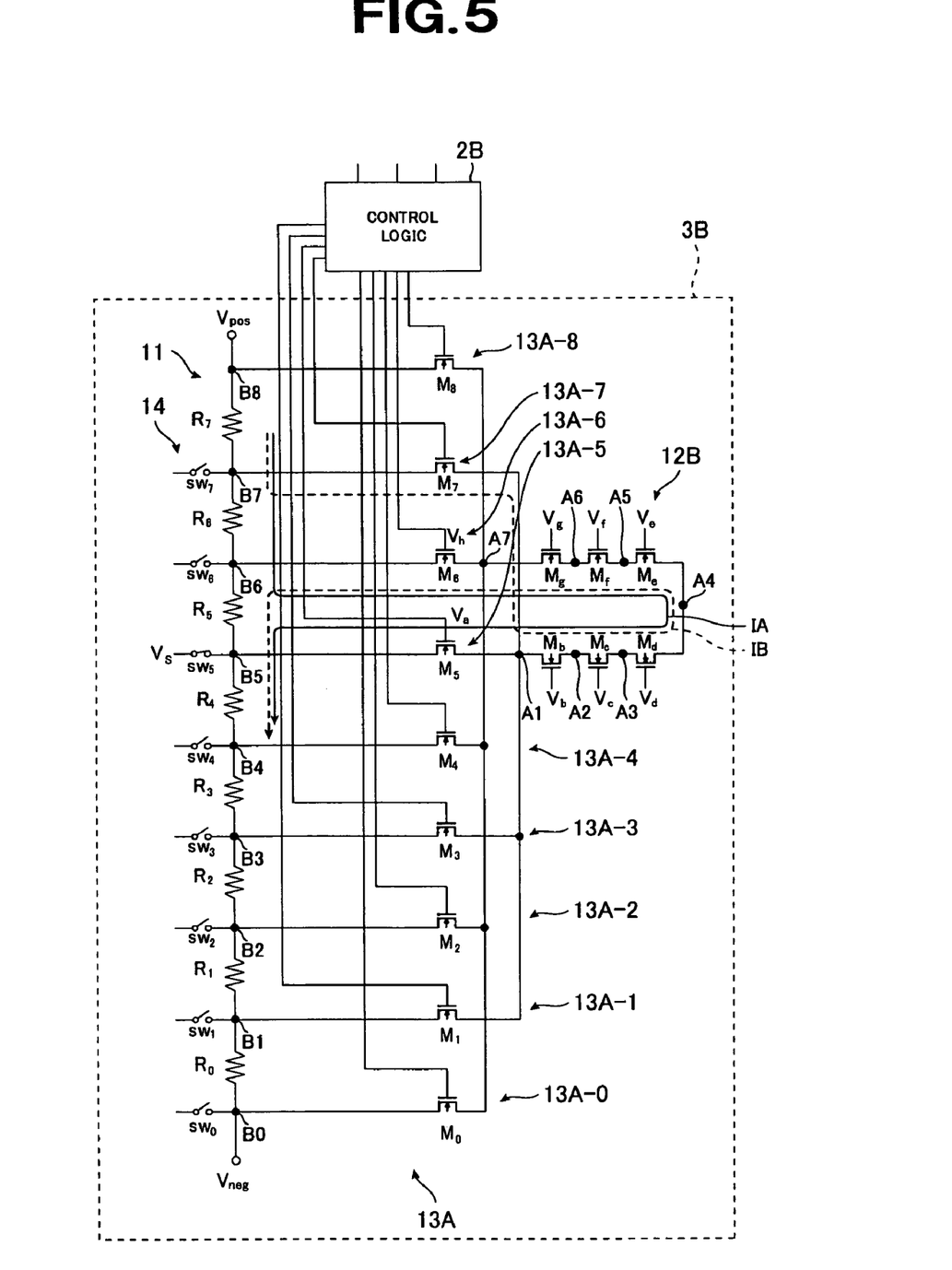
FIG. 5 is a partial circuit diagram of a resistor-string D/A converter circuit according to a third embodiment of the present invention.
Figure 6:
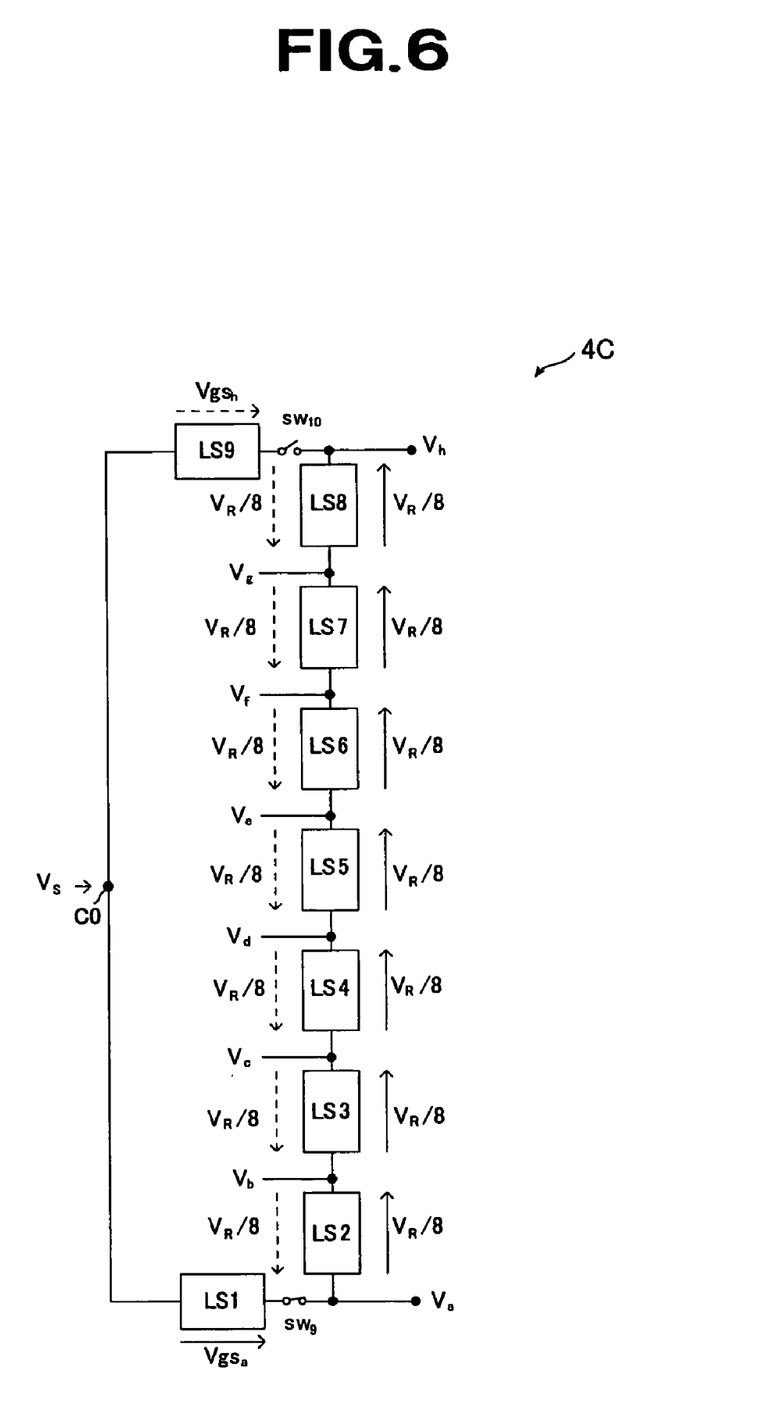
FIG. 6 is a circuit diagram of a gate potential generating circuit according to the third embodiment.

FIGS. 5 and 6 are circuit diagrams for explaining a configuration of a resistor-string D/A converter circuit according to a third embodiment of the present invention. FIG. 5 is a partial circuit diagram of a control logic circuit 2B and a voltage dividing circuit 3B including a plurality of resistors and a plurality of MOS transistors of the resistor-string D/A converter circuit according to the third embodiment. FIG. 6 is a circuit diagram of a gate potential generating circuit 4C. It should be noted that in the present embodiment, again, to simplify the description, there will be described an exemplary D/A converter circuit in which a digital signal of 6 bits is converted into an analog signal. Also, the same reference characters are applied to constituent elements corresponding to those of the first and second embodiments, and an explanation thereof is omitted.

The voltage dividing circuit 3B includes a MOS transistor group 12B constituting an interpolation resistance. The MOS transistor group 12B includes a plurality of MOS transistors $M_b$, $M_c$, $M_d$, $M_e$, $M_f$ and $M_g$. The plurality of MOS transistors $M_b$, $M_c$, $M_d$, $M_e$, $M_f$ and $M_g$ are connected in series so that the source and drain are mutually connected.

To each gate of the plurality of MOS transistors $M_b$, $M_c$, $M_d$, $M_e$, $M_f$ and $M_g$, there are supplied potentials $V_b$ to $V_g$ generated in the gate potential generating circuit 4C of FIG. 6, respectively.

Further, the voltage dividing circuit 3B includes an interpolation resistance connection use connection switch group 13A for selecting which of the resistors of the resistor group 11 is connected to the MOS interpolation resistance. The interpolation resistance connection use connection switch group 13A is constituted of a plurality of connection switches for connecting one of the resistors of the resistor group 11 to the interpolation use MOS transistor group 12. The plurality of connection switches 13A-0 to 13A-8 of the connection switch group 13A are each composed of one N channel MOS transistor.

In the second embodiment, depending on the change of the polarity of the interpolation use MOS transistor group 12A when connected, the gate potential of the interpolation use MOS transistor is changed. Consequently, the connection switches 13A-k of the interpolation resistance connection use connection switch group 13A each use only one MOS transistor. By contrast, in the present embodiment, the polarity of the potential generated in the gate potential generating circuit 4C is changed, whereby the switch for changing the gate potential of the interpolation use MOS transistor shown in the second embodiment can be omitted.

The connection switches 13A-k for interpolation resistance connection are MOS transistors $M_0$ to $M_8$, respectively, and act as the switch for changing the connection between the both end nodes of the resistor group 11 and a plurality of connection nodes between each resistor and the MOS transistors $M_b$ to $M_g$ being the MOS interpolation resistances. The connection switches 13A-k themselves also act as part of the MOS interpolation resistance.

Among the MOS transistors $M_0$ to $M_8$, potential $V_a$ is supplied to any one of the gates of the MOS transistors $M_1$, $M_3$, $M_5$ and $M_7$; potential $V_h$ is supplied to any one of the gates of the MOS transistors $M_0$, $M_2$, $M_4$, $M_6$ and $M_8$.

The gate potential generating circuit 4C of FIG. 6 has nine level shift circuits LS1 to LS9. Between the level shift circuits LS1 and LS2, there is provided a switch $sw_9$. Between the level shift circuits LS8 and LS9, there is provided a switch $sw_{10}$. The level shift circuits LS1 and LS9 are connected and potential $V_s$ is supplied to a connection node C0 therebetween. The seven level shift circuits LS2 to LS8 connected in series and the two level shift circuits LS1 and LS9 are connected in series via the switches.

The operation when the interpolation resistance is connected to the resistor $R_5$ will be described below. In this case, the MOS transistors $M_5$ and $M_6$ are turned on, and the other MOS transistors for interpolation resistance connection are all turned off. Consequently, the interpolation resistance is connected to both ends of the resistor $R_5$.

The control logic circuit 2B supplies, according to higher-order bit 6a, a selection signal to the connection switch $sw_5$ to be turned on from among the connection switch group 14. At the same time, the control logic circuit 2B turns on the switch $sw_9$ to close and turns off the switch $sw_{10}$ to open.

When the switch $sw_5$ is turned on, the source potential $V_s$ of the MOS transistor $M_5$ is supplied to the connection node C0 of FIG. 6 and monitored by the gate potential generating circuit 4C.

In the gate potential generating circuit 4C, the switch $sw_9$ is in an ON state and the switch $sw_{10}$ is in an OFF state. Thus, potential $V_a$ being the result of being level-shifted by a voltage ($V_{gsa}$) required for turning on the MOS transistor $M_5$ from potential $V_s$ is generated by the level shift circuit LS1 and supplied to the gate of the MOS transistor $M_5$ via the control logic circuit 2B.

In the gate potential generating circuit 4C, potentials $V_b$ to $V_h$ being the result of being sequentially level-shifted by a value obtained by dividing voltage $V_R$ applied to the resistor $R_5$ by eight from potential $V_a$ are generated by the level shift circuits LS2 to LS8, and are supplied as the gate potential of $M_b$ to $M_g$ and $M_6$, respectively, directly or via the control logic circuit 2B. As a result, in FIG. 6, voltage is generated in an arrow direction indicated by a solid line.

Here, an example is described in which the control logic circuit 2B supplies, according to higher-order bit 6a, a selection signal to the connection switch $sw_5$ to be turned on from among the connection switch group 14, and potentials $V_a$ and $V_h$ are supplied to the gate of the MOS transistors $M_5$ and $M_6$, respectively. As described above, in the control logic circuit 2, according to higher-order bit 6a received, there are preliminarily set a connection switch $sw_i$ preliminarily selected, and which of the switches $sw_9$ and $sw_{10}$ is turned on/off, and further a combination of MOS transistors to be supplied, respectively, with potentials $V_a$ and $V_h$.

Consequently, when the connection switch $sw_5$ is turned on, the lower potential side potential of the resistor $R_5$, i.e., the source potential $V_s$ of the MOS transistor $M_5$ is supplied to the connection node C0 of the gate potential generating circuit 4C. That is, the source potential $V_s$ of the MOS transistor $M_5$ is monitored by the gate potential generating circuit 4C. As a result, in FIG. 5, current flows in a direction indicated by the solid line IA.

The operation will now be described when the interpolation resistance is connected to the resistor $R_6$. When the interpolation resistance is connected to the resistor $R_6$, the MOS transistors $M_6$ and $M_7$ are turned on, and the other MOS transistors for interpolation resistance connection are all turned off. Consequently, the interpolation resistance is connected to both ends of the resistor $R_6$.

The control logic circuit 2B supplies, according to higher-order bit 6a, a selection signal to the connection switch $sw_6$ to be turned on from among the connection switch group 14. At the same time, the control logic circuit 2B turns on the switch $sw_{10}$ to close and turns off the switch $sw_9$ to open.

When the switch $sw_6$ is turned on, the source potential $V_s$ of the MOS transistor $M_6$ is supplied to the connection node C0 of FIG. 6 and monitored by the gate potential generating circuit 4C.

In the gate potential generating circuit 4C, the switch $sw_{10}$ is in an ON state and the switch $sw_9$ is in an OFF state. Thus, potential $V_h$ being the result of being level-shifted by a voltage ($V_{gsh}$) required for turning on the MOS transistor $M_6$ from potential $V_s$ is generated by the level shift circuit LS9 and supplied to the gate of the MOS transistor $M_6$.

In the gate potential generating circuit 4C, potentials $V_g$ to $V_a$ being the result of being sequentially level-shifted by a value obtained by dividing voltage $V_R$ applied to the resistor $R_6$ by eight from potential $V_h$ are generated by the level shift circuits LS8 to LS2, and are supplied as the gate potential of $M_g$ to $M_b$ and $M_7$, respectively. As a result, in FIG. 6, voltage is generated in an arrow direction indicated by the dotted line.

That is, in the gate potential generating circuit 4C, when the interpolation resistance is connected to the resistor $R_5$, potentials $V_a$, $V_b$ to $V_g$ and $V_h$ are generated in a manner that potential increases in that order; when the interpolation resistance is connected to the resistor $R_6$, potentials $V_h$, $V_g$ to $V_b$ and $V_a$ are generated in a manner that potential increases in that order. As a result, in FIG. 5, current flows in a direction indicated by dotted line IB.

Thus, according to changing of the polarity when the interpolation use MOS transistor group 12B is connected, current direction in the gate potential generating circuit 4C is changed without providing switches for the gates of the interpolation use MOS transistors $M_g$ to $M_h$, whereby voltage $V_R$ applied to the resistors of the resistor group 11 is properly divided, with voltage $V_{gs}$ of the eight MOS transistors made constant. Here, again, with the connection node potential $V_s$ being the lower potential side reference potential, voltage $V_R$ is divided by eight.

As described above, according to the present embodiment, also, nonuniformity of resistance value of each MOS resistance acting as MOS interpolation resistance is reduced and linearity of D/A conversion is improved. Further, according to a resistor selected from among the resistor group 11, the polarity of connection of the interpolation use MOS transistor group 12B is changed, so the connection switches 13A-k of the interpolation resistance connection use connection switch group 13A each use only one MOS transistor, thus simplifying the circuit configuration.

Figure 7:
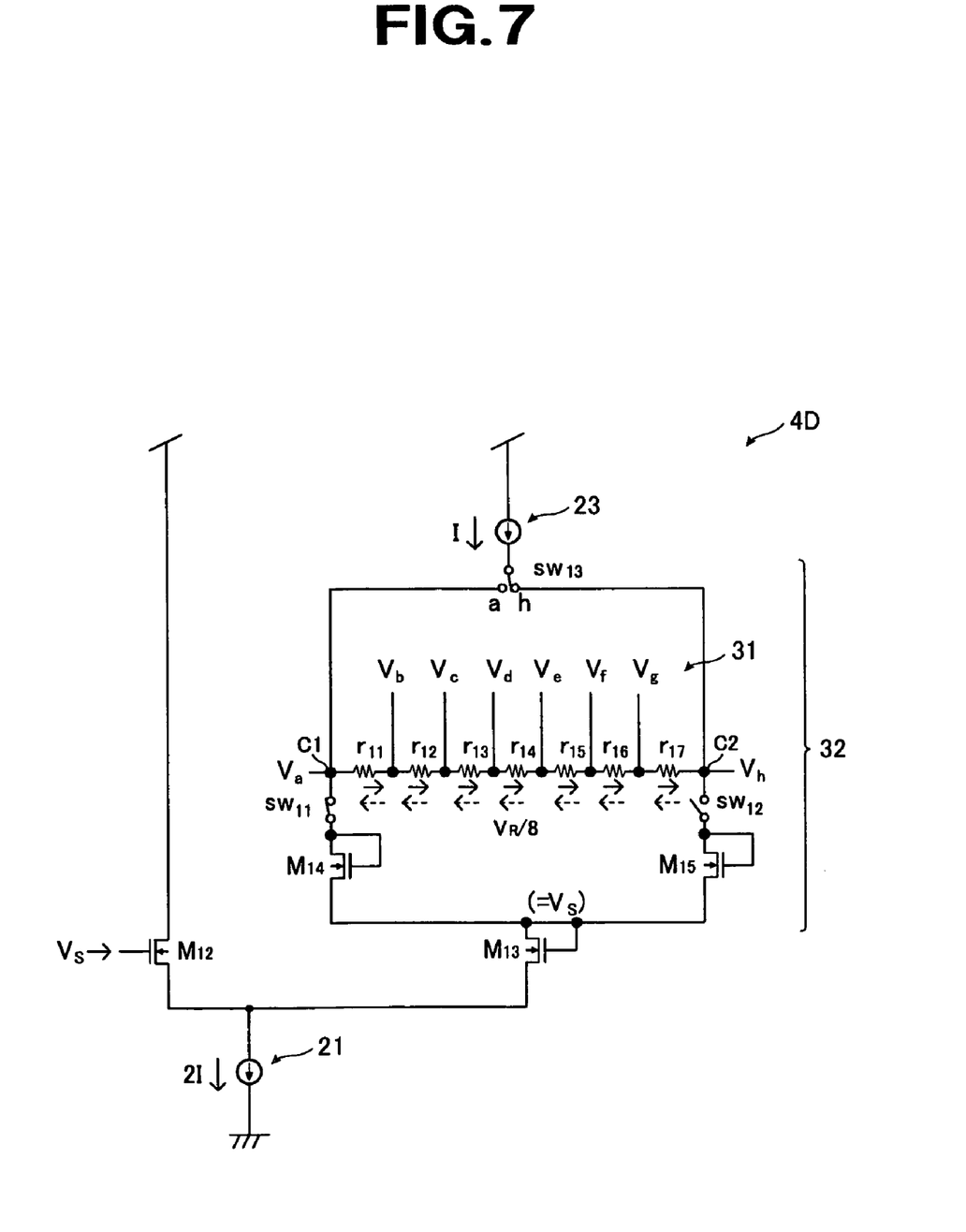
FIG. 7 is a circuit diagram showing a variation of the gate potential generating circuit according to the third embodiment.

FIG. 7 is a circuit diagram showing a variation of the gate potential generating circuit 4C. The gate potential generating circuit 4D shown in FIG. 7 has a constant current source 21 and an N channel MOS transistor $M_{12}$ whose source is connected to the constant current source 21. Further, the gate potential generating circuit 4D includes a resistor group 31 constituted of seven resistors $r_{11}$ to $r_{17}$ connected in series.

A circuit 32 including a constant current source 23, the resistor group 31, three N channel MOS transistors $M_{13}$, $M_{14}$ and $M_{15}$, and switches $sw_{11}$, $sw_{12}$ and $sw_{13}$ is connected in parallel to a MOS transistor $M_{12}$. The respective sources of the MOS transistors $M_{12}$ and $M_{13}$ are connected to the constant current source 21. The MOS transistors $M_{12}$ and $M_{13}$ constitute a differential pair. The constant current source 21 supplies current 21. The constant current source 23 supplies current I to the resistor group 31 via the switch $sw_{13}$.

The constant current source 23 is connected to the resistor group 31 via the switch $sw_{13}$. More specifically, the constant current source 23 is connected to one of both ends of the resistor group 31 via the switch $sw_{13}$. According to switching of the switch $sw_{13}$, current from the constant current source 23 is supplied to one of the two outputs a and h. When the switch $sw_{13}$ is switched to the h side, the constant current source 23 is connected to one end of the resistor $r_{17}$; when the switch $sw_{13}$ is switched to the a side, the constant current source 23 is connected to one end of the resistor $r_{11}$.

The a side of the switch $sw_{13}$ is further connected to the drain of the MOS transistor $M_{14}$ via the switch $sw_{11}$. The h side of the switch $sw_{13}$ is further connected to the drain of the MOS transistor $M_{15}$ via the switch $sw_{12}$. The respective sources of the MOS transistors $M_{14}$ and $M_{15}$ are connected to the drain of the MOS transistor $M_{13}$. A connection node C1 between the switches $sw_{13}$ and $sw_{11}$ acts as a node for extracting potential Va. A connection node C2 between the switches $sw_{13}$ and $sw_{12}$ acts as a node for extracting potential $V_h$.

The MOS transistors $M_{13}$, $M_{14}$ and $M_{15}$ are diode-connected (i.e., the gate and drain is mutually connected).

The MOS transistors $M_{12}$ and $M_{13}$ are equal in gate length and gate width. The MOS transistors $M_{14}$ and $M_{15}$ are equal in gate length and gate width. Resistors $r_{11}$ to $r_{17}$ of the resistor group 31 have the same resistance value. The resistance value of each resistor is assumed to be $r=(V_R/8)/I$. From both end nodes of the resistor group 31 and connection nodes between each resistor, as shown in FIG. 7, there are extracted the above described potentials $V_a$ to $V_h$. Potentials $V_a$ to $V_h$ are supplied to the gate of the respective MOS transistors in FIG. 5 directly or via the control logic circuit 2B.

Next, the operation of the gate potential generating circuit 4D will now be described.

When potential $V_s$ is supplied from the voltage dividing circuit 3B to the gate of the MOS transistor $M_{12}$, the MOS transistors $M_{12}$ and $M_{13}$ operate as a differential pair. The same amount of current (i.e., current quantity I) flows through the MOS transistors $M_{12}$ and $M_{13}$, and the source potentials of these transistors are equal. Consequently, the gate voltage and drain voltage of the MOS transistor $M_{13}$ are equal to potential $V_s$.

As shown in FIG. 5, when the interpolation resistance is connected to the resistor $R_5$, the control logic circuit 2B supplies, according to higher-order bit 6a, a selection signal to the connection switch $sw_5$ to be turned on from among the connection switch group 14. At the same time, the control logic circuit 2B turns on the switch $sw_{11}$ to close and turns off the switch $sw_{10}$ to open. Further, the control logic circuit 2B changes the switch $sw_{13}$ to the h side.

In the gate potential generating circuit 4D, the switch $sw_{11}$ is in an ON state and the switch $sw_{12}$ is in an OFF state. Thus, potential $V_a$ being the result of being level-shifted by a voltage ($V_{gsa}$) required for turning on the MOS transistor M5 from potential $V_s$ is generated at the connection node C1 by the MOS transistor $M_{14}$ and supplied to the gate of the MOS transistor $M_5$.

In the gate potential generating circuit 4D, potentials $V_b$ to $V_h$ being the result of being sequentially level-shifted by a value obtained by dividing voltage $V_R$ applied to the resistor $R_5$ by eight from potential $V_a$ are generated by the resistors $r_{11}$ to $r_{17}$ and supplied as the gate potential of $M_b$ to $M_g$ and $M_6$, respectively.

Also, when the interpolation resistance is connected to the resistor $R_6$, the control logic circuit 2B supplies, according to higher-order bit 6a, a selection signal to the connection switch $sw_6$ to be turned on from among the connection switch group 14. At the same time, the control logic circuit 2B turns off the switch $sw_{11}$ to open and turns on the switch $sw_{10}$ to close. Further, the control logic circuit 2B changes the switch $sw_{13}$ to the a side.

In the gate potential generating circuit 4D, the switch $sw_{11}$ is in an OFF state and the switch $sw_{12}$ is in an ON state. Thus, potential $V_h$ being the result of being level-shifted by a voltage ($V_{gsh}$) required for turning on the MOS transistor $M_6$ from potential $V_s$ is generated at the connection node C2 by the MOS transistor $M_{15}$ and supplied to the gate of the MOS transistor $M_6$.

In the gate potential generating circuit 4D, potentials $V_h$ to $V_5$ being the result of being sequentially level-shifted by a value obtained by dividing voltage $V_R$ applied to the resistor $R_6$ by eight from potential $V_a$ are created by the resistors $r_{17}$ to $r_{11}$ and supplied as the gate potential of $M_g$ to $M_b$ and $M_7$, respectively.

As described above, in the gate potential generating circuit 4D, gate potential $V_a$ or $V_h$ to turn on the MOS transistor is created from potential $V_s$, and with potential $V_a$ or $V_h$ being the lower side reference potential, voltages being the result of being level-shifted by potential $V_R/8$ from potential $V_a$ or $V_h$ can be outputted from the connection nodes between each resistor of the resistor group 31.

As described above, according to each of the embodiments described above, dividing voltage $V_s$ is monitored and on the basis of this potential $V_s$, different gate potentials are created so that the respective gate-source voltages ($V_{gs}$) of a plurality of MOS transistors acting as the interpolation resistance are equal to each other. Accordingly, in the D/A converter circuit according to the present embodiment, the variation in MOS resistance value (body effect) ascribable to switching of interpolation resistance connection location can be reduced. At the same time, nonuniformity of each MOS resistance value can also be reduced, allowing improvement of the linearity of D/A conversion. Particularly, when the potential difference across a resistor being the object of interpolation is large, the configuration according to the present embodiment is effective.

It should be noted that in each of the embodiments described above, voltage $V_R$ is level-shifted by a value obtained by dividing it by eight corresponding to lower-order three bits. However, when the number of lower-order bits is not three but n, there is used an interpolation resistance using a plurality of MOS transistors so that the level shifting is performed by a value obtained by dividing $V_R$ by $2^n$.

Similarly, when m-bit D/A conversion circuit and n-bit D/A conversion circuit are implemented by a resistor group and an interpolation resistance by MOS resistance, respectively, $2^m$-number of resistors and $2^n$-number of MOS transistors are required.

Also, the D/A conversion circuit according to each of the embodiments described above is implemented as a semiconductor device such as a semiconductor chip performing the digital/analog conversion function alone or a semiconductor chip performing the function as well as another function.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A resistor-string digital/analog converter circuit converting a digital signal into an analog signal, the circuit comprising:
    a plurality of resistors configured to divide a predetermined voltage;
    a plurality of MOS transistors configured to divide a voltage generated across one resistor of the plurality of resistors;
    a control circuit configured to control a connection between the one resistor and the plurality of MOS transistors so as to supply to the plurality of MOS transistors the voltage generated across the one resistor; and
    a gate potential generating circuit configured to generate a plurality of mutually different gate potentials that increase or decrease in the order of connection of the plurality of MOS transistors and supply the plurality of generated gate voltages, respectively, to a plurality of gates of the plurality of MOS transistors so as to make the resistance values of MOS resistance of the plurality of MOS transistors equal to each other.

2. The resistor-string digital/analog converter circuit according to claim 1, further comprising a plurality of connection switches connected, respectively, to each end of the plurality of resistors, wherein the control circuit controls, according to the digital signal received, the connection between the one resistor and the plurality of MOS transistors by controlling the plurality of connection switches.

3. The resistor-string digital/analog converter circuit according to claim 2, wherein the plurality of connection switches each include two MOS transistors, and according to the digital signal, one is selected from among the two MOS transistors of the plurality of connection switches.

4. The resistor-string digital/analog converter circuit according to claim 3, wherein:
    the control circuit selects, according to higher-order bits of the digital signal, the one resistor, and controls the connection so as to connect both ends of the one resistor selected to the plurality of MOS transistors via one of the two MOS transistors, respectively; and
    the analog signal outputted is a source or drain voltage signal of one MOS transistor of the plurality of MOS transistors which is selected according to lower-order bits of the digital signal.

5. The resistor-string digital/analog converter circuit according to claim 4, wherein the gate potential generating circuit includes a plurality of level shift circuits configured to generate respective predetermined potentials, and the plurality of level shift circuits generate the plurality of different gate potentials, respectively.

6. The resistor-string digital/analog converter circuit according to claim 5, wherein:
    the gate potential generating circuit is a circuit having the plurality of level shift circuits connected in series; and
    the control circuit controls the connection so as to connect one end of the one resistor selected to one end of the circuits connected in series.

7. The resistor-string digital/analog converter circuit according to claim 5, wherein the plurality of level shift circuits include two transistors constituting a differential pair and a plurality of resistors connected in series connected to one of the two transistors.

8. The resistor-string digital/analog converter circuit according to claim 2, wherein the plurality of connection switches each include one MOS transistor.

9. The resistor-string digital/analog converter circuit according to claim 8, wherein:
    the control circuit selects, according to higher-order bits of the digital signal, the one resistor, and controls the connection so as to connect both ends of the one resistor selected to the plurality of MOS transistors via the two MOS transistors, respectively; and
    the analog signal outputted is a source or drain voltage signal of one MOS trasistor of the plurality of MOS transistors which is selected according to lower-order bits of the digital signal.

10. The resistor-string digital/analog converter circuit according to claim 9, wherein to each gate of the plurality of MOS transistors, there is connected a switch configured to select, according to selection of the one resistor, a connection destination in the gate potential generating circuit.

11. The resistor-string digital/analog converter circuit according to claim 9, wherein the gate potential generating circuit includes a plurality of level shift circuits configured to generate respective predetermined potentials, and the plurality of level shift circuits generate the plurality of different gate potentials, respectively.

12. The resistor-string digital/analog converter circuit according to claim 11, wherein:
    the gate potential generating circuit is a circuit having the plurality of level shift circuits connected in series; and
    the control circuit controls the connection so as to connect one end of the one resistor selected to one end of the circuits connected in series.

13. The resistor-string digital/analog converter circuit according to claim 9, wherein to each gate of the plurality of MOS transistors, there is supplied a gate voltage corresponding to selection of the one resistor.

14. The resistor-string digital/analog converter circuit according to claim 13, wherein:
    the gate potential generating circuit is a circuit having the plurality of level shift circuits connected in series; and
    the control circuit changes, according to selection of the one resistor, the polarity of potential generated in the circuits connected in series to supply to each gate of the plurality of MOS transistors a gate voltage corresponding to selection of the one resistor.

15. The resistor-string digital/analog converter circuit according to claim 13, wherein:
    the gate potential generating circuit is a circuit including two transistors constituting a differential pair and a plurality of resistors connected in series connected to one of the two transistors; and
    the control circuit changes, according to selection of the one resistor, the polarity of potential generated in the gate potential generating circuit to supply to each gate of the plurality of MOS transistors a gate voltage corresponding to selection of the one resistor.

16. A semiconductor device including a resistor-string digital/analog converter circuit configured to convert a digital signal into an analog signal, the semiconductor device comprising:

a plurality of resistors configured to divide a predetermined voltage;

a plurality of MOS transistors configured to divide a voltage generated across one resistor of the plurality of resistors;

a control circuit configured to control a connection between the one resistor and the plurality of MOS transistors so as to supply to the plurality of MOS transistors the voltage generated across the one resistor; and a gate potential generating circuit configured to generate a plurality of mutually different gate potentials that increase or decrease in the order of connection of the plurality of MOS transistors and supply the plurality of generated gate voltages, respectively, to a plurality of gates of the plurality of MOS transistors so as to make the resistance values of MOS resistance of the plurality of MOS transistors equal to each other.

17. A semiconductor device including a resistor-string digital/analog converter circuit configured to control a digital signal into an analog signal, the semiconductor device comprising:

an input unit configured to receive the digital signal;

a plurality of resistors configured to divide a predetermined voltage;

a plurality of MOS transistors configured to divide a voltage generated across one resistor of the plurality of resistors;

a gate potential generating circuit configured to generate a plurality of mutually different gate potentials that increase or decrease in the order of connection of the plurality of MOS transistors and supply the plurality of generated gate voltages, respectively, to a plurality of gates of the plurality of MOS transistors so as to make the resistance values of MOS resistance of the plurality of MOS transistors equal to each other;

a control logic circuit configured to control a connection between the one resistor and the plurality of MOS transistors so as to supply the voltage generated across the one resistor to the plurality of MOS transistors by selecting, according to higher-order bits of the digital signal, the one resistor and connecting both ends of the one resistor selected, respectively, to the plurality of MOS transistors; and an output unit configured to output as the analog signal a source voltage or a drain voltage of one MOS transistor of the plurality of MOS transistors which is selected according to lower-order bits of the digital signal.

18. The semiconductor device according to claim 17, further comprising a plurality of connection switches connected, respectively, to each end of the plurality of resistors, wherein the control circuit controls the connection between the one resistor and the plurality of MOS transistors by controlling the plurality of connection switches, according to higher-order bits of the digital signal received.

19. The semiconductor device according to claim 18, wherein the plurality of connection switches each include two MOS transistors, and according to higher-order bits of the digital signal, one is selected from among two MOS transistors of the plurality of connection switches.

20. The semiconductor device according to claim 18, wherein the plurality of connection switches each include one MOS transistor.

* * * * *